(12) United States Patent
Wirth

(10) Patent No.: US 11,107,709 B2
(45) Date of Patent: Aug. 31, 2021

(54) TEMPERATURE-CONTROLLABLE PROCESS CHAMBERS, ELECTRONIC DEVICE PROCESSING SYSTEMS, AND MANUFACTURING METHODS

(71) Applicant: Applied Materials, Inc., Santa Clara, CA (US)

(72) Inventor: Paul Z. Wirth, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 120 days.

(21) Appl. No.: 16/261,763

(22) Filed: Jan. 30, 2019

(65) Prior Publication Data

US 2020/0243354 A1 Jul. 30, 2020

(51) Int. Cl.
| | |
|---|---|
| *H01L 21/00* | (2006.01) |
| *H01L 21/67* | (2006.01) |
| *F27D 3/00* | (2006.01) |
| *F27D 5/00* | (2006.01) |
| *F27D 11/02* | (2006.01) |
| *F27D 21/00* | (2006.01) |
| *H01L 21/324* | (2006.01) |
| *F27D 19/00* | (2006.01) |

(52) U.S. Cl.
CPC ...... *H01L 21/67103* (2013.01); *F27D 3/0084* (2013.01); *F27D 5/0037* (2013.01); *F27D 11/02* (2013.01); *F27D 19/00* (2013.01); *F27D 21/0014* (2013.01); *H01L 21/324* (2013.01); *H01L 21/67248* (2013.01); *F27D 2019/0003* (2013.01)

(58) Field of Classification Search
CPC ............. H01L 21/324; H01L 21/67248; H01L 21/67103; F27D 5/0037; F27D 11/02; F27D 19/00; F27D 21/0014

USPC ................................................. 438/758, 795
See application file for complete search history.

(56) References Cited

U.S. PATENT DOCUMENTS

| | | |
|---|---|---|
| 5,951,770 A | 9/1999 | Perlov et al. |
| 6,015,465 A | 1/2000 | Kholodenko et al. |
| (Continued) | | |

FOREIGN PATENT DOCUMENTS

KR 20160115398 A 10/2016

OTHER PUBLICATIONS

Ram Dayal Malviya et al., U.S. Appl. No. 16/164,214, titled: "Load Lock Body Portions, Load Lock Apparatus, and Methods for Manufacturing the Same," filed Oct. 18, 2018.

(Continued)

*Primary Examiner* — Brook Kebede
(74) *Attorney, Agent, or Firm* — Lowenstein Sandler LLP

(57) ABSTRACT

A temperature-controllable process chamber configured to process substrates may include one or more vertical walls at least partially defining a chamber portion of the process chamber. Multiple zones may be located about a periphery of the one or more vertical walls and multiple temperature control devices are thermally coupled to the periphery of the one or more vertical walls in each of the multiple zones. A controller coupled to the temperature control devices may be configured to individually control temperatures of the multiple temperature control devices to obtain substantial temperature uniformity across a substrate located in the chamber portion. Other systems and methods of manufacturing substrates are disclosed.

19 Claims, 6 Drawing Sheets

(56) References Cited

U.S. PATENT DOCUMENTS

| | | |
|---|---|---|
| 6,287,386 B1 | 9/2001 | Perlov et al. |
| 6,326,597 B1 | 12/2001 | Lubomirsky et al. |
| 6,468,353 B1 | 10/2002 | Perlov et al. |
| 6,575,737 B1 | 6/2003 | Perlov et al. |
| 6,916,397 B2 | 7/2005 | Pfeiffer et al. |
| 7,720,655 B2 | 5/2010 | Rice |
| 2001/0042594 A1 | 11/2001 | Shamouilian et al. |
| 2002/0170672 A1 | 11/2002 | Perlov et al. |
| 2004/0020601 A1* | 2/2004 | Zhao ............... H01L 21/0234 156/345.32 |
| 2004/0060917 A1 | 4/2004 | Liu et al. |
| 2005/0072716 A1 | 4/2005 | Quiles et al. |
| 2006/0137609 A1* | 6/2006 | Puchacz ............ H01L 21/6719 118/719 |
| 2007/0128861 A1 | 6/2007 | Kim et al. |
| 2009/0108544 A1 | 4/2009 | Sico et al. |
| 2009/0232967 A1* | 9/2009 | Takenaga ............ C23C 16/402 427/9 |
| 2010/0248496 A1* | 9/2010 | Wei ..................... H01L 21/324 438/758 |
| 2014/0262035 A1 | 9/2014 | Merry et al. |
| 2014/0262036 A1 | 9/2014 | Reuter et al. |
| 2014/0262755 A1 | 9/2014 | Deshmukh et al. |
| 2014/0263165 A1 | 9/2014 | Hongkham et al. |
| 2014/0271057 A1 | 9/2014 | Weaver et al. |
| 2014/0273487 A1 | 9/2014 | Deshmukh et al. |
| 2015/0013771 A1 | 1/2015 | Quiles et al. |
| 2015/0070814 A1 | 3/2015 | Parkhe et al. |
| 2015/0082625 A1 | 3/2015 | Rice et al. |
| 2015/0083330 A1 | 3/2015 | Madiwal et al. |
| 2015/0357228 A1 | 12/2015 | Busche et al. |
| 2015/0364354 A1 | 12/2015 | Tantiwong et al. |
| 2016/0007411 A1 | 1/2016 | Busche et al. |
| 2016/0007412 A1 | 1/2016 | Busche et al. |
| 2016/0225646 A1 | 8/2016 | Rice et al. |
| 2016/0227606 A1 | 8/2016 | Samir et al. |
| 2016/0240410 A1 | 8/2016 | Reuter et al. |
| 2016/0358792 A1 | 12/2016 | Madiwal et al. |
| 2017/0011887 A1 | 1/2017 | Deshmukh et al. |
| 2017/0051407 A1 | 2/2017 | Kwong et al. |
| 2017/0115169 A1 | 4/2017 | Busche |
| 2017/0211706 A1 | 7/2017 | Amir et al. |
| 2017/0236733 A1 | 8/2017 | Leeser |
| 2017/0290166 A1 | 10/2017 | Rice et al. |
| 2018/0082870 A1 | 3/2018 | Wolgast |
| 2018/0374719 A1 | 12/2018 | Waqar et al. |

OTHER PUBLICATIONS

PCT International Search Report and Written Opinion for International Application No. PCT/US2020/014179, dated May 12, 2020, 9 pages.

\* cited by examiner

TEMPERATURE-CONTROLLABLE PROCESS CHAMBERS, ELECTRONIC DEVICE PROCESSING SYSTEMS, AND MANUFACTURING METHODS

FIELD

The present disclosure relates to electronic device manufacturing, and more specifically to temperature-controllable process chambers.

BACKGROUND

Electronic device manufacturing systems may include a plurality of process chambers arranged around and coupled to a mainframe body. The process chambers are configured to perform various processes on substrates inserted therein. Some processes involve heating the substrates to very high temperatures. Some process chambers can include chamber pedestal heaters that heat the substrates resident thereon during processing. However, pedestal heaters can be deficient in some respects.

SUMMARY

In a first aspect, a process chamber configured to process substrates is disclosed. The process chamber includes one or more vertical walls at least partially defining a chamber portion of the process chamber; multiple zones located about a periphery of the one or more vertical walls; a temperature control device thermally coupled to the one or more vertical walls in each of the multiple zones; and a controller coupled to the temperature control devices and configured to control temperatures of one or more of the temperature control devices to obtain a temperature uniformity within 2% (or more uniform) across a substrate located in the chamber portion.

In another aspect, an electronic device processing system is disclosed. The system includes a transfer chamber; one or more process chambers coupled to the transfer chamber, at least one of the one or more process chambers including: one or more walls; and multiple temperature control devices thermally coupled to the one or more walls. The system further including a controller coupled to the multiple temperature control devices and configured to individually control a temperature of the multiple temperature control devices to obtain temperature uniformity across the substrate within a predetermined value.

In another aspect, a method for manufacturing substrates is disclosed. The method includes providing a process chamber having one or more walls, thermally coupling multiple temperature control devices on the one or more walls; placing a substrate within the process chamber, and individually controlling the multiple temperature control devices to obtain temperature uniformity within a predetermined value across the substrate.

Other features and aspects of the present disclosure will become more fully apparent from the following detailed description, the appended claims, and the accompanying drawings.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Figure 1:
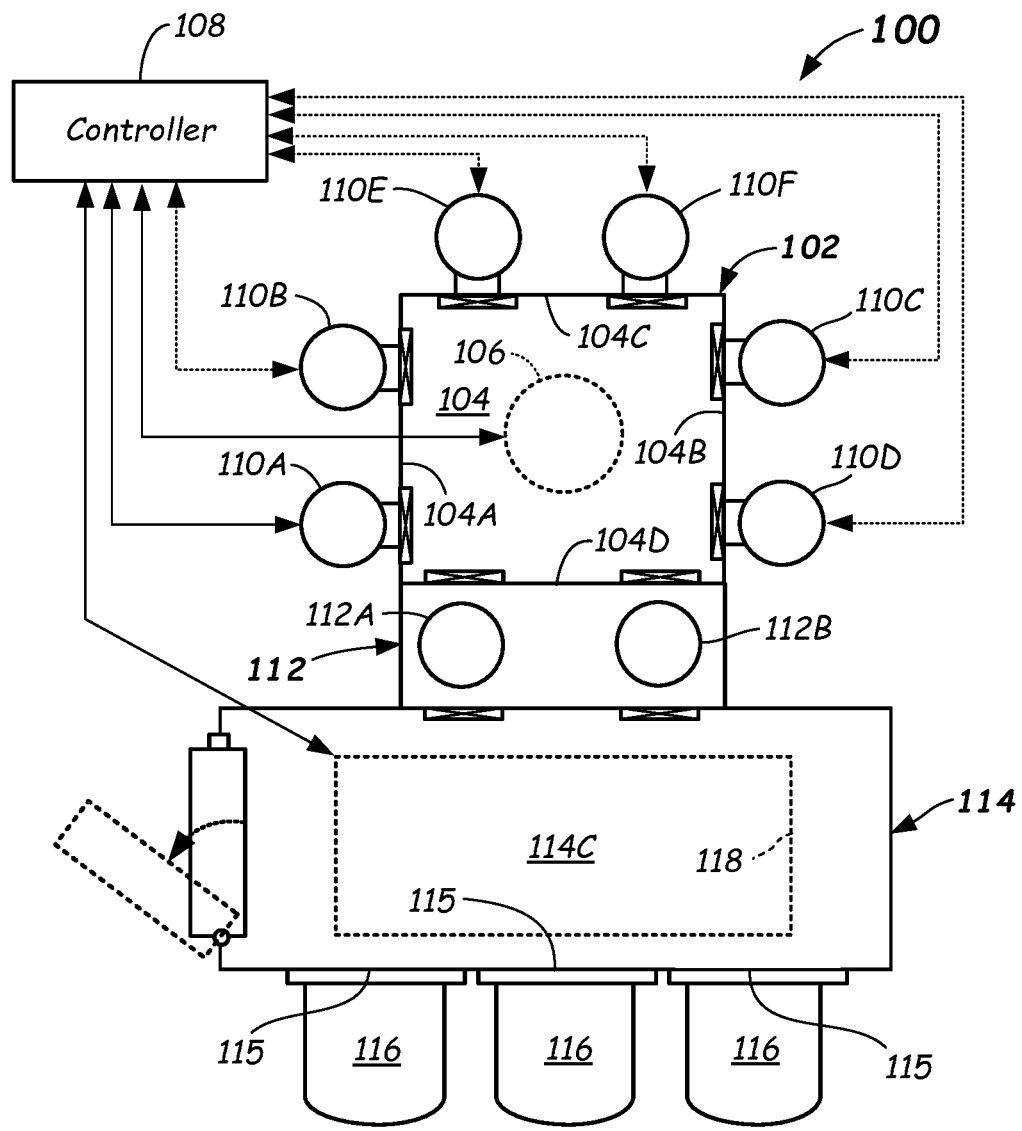
FIG. 1 illustrates a schematic top view of an electronic device processing system including one or more temperature-controllable process chambers according to one or more embodiments of the disclosure.

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing systems may include multiple process chambers that perform various processes on substrates inserted therein. Substrates, as used herein, shall mean articles used to make electronic devices or circuit components, such as semiconductor wafers, silicon-containing wafers or bodies, patterned or unpatterned wafers, glass plates, masks, and the like. The processes may include dielectric deposition, atomic layer deposition (ALD), atomic layer etching, etching, preheating, cleaning, annealing, and the like. Other suitable processes may be carried out as well. During some processes performed within the process chambers, the substrates may be heated to very high temperatures, such as above 60° C., above 350° C., or even above 550° C., and between 60° C. and 700° C. for many embodiments. For example, various etch processes may take place at between 60° C. and 120° C., various plasma vapor deposition (PVD) processes may take place between 350° C. and 400° C., and various chemical vapor deposition (CVD) may take place between 550° C. and 600° C.

Some process chambers include pedestals supported by pedestal shafts, wherein the pedestals support the substrates. The pedestals may include pedestal heaters that heat the substrates during processing. However, some semiconductor processes involve a very high temperature and a goal of substantial temperature uniformity across the substrates. Such uniformity is difficult to achieve with pedestal heaters. Temperature uniformity, as defined herein, means no more than a maximum temperature difference between different locations on a substrate. Some substrate processes can include temperature uniformity of less than 2% across a substrate, meaning that the difference between the hottest portion of a substrate and the coolest portion of a substrate varies by no more than 2%. Other processes can involve temperature uniformity of less than 1%, and other processes can involve temperature uniformity of less than 0.5%, or even less than 0.1% temperature difference between the hottest portion of a substrate and the coolest portion thereof.

Attempts at uniform temperature control (e.g., heating) of a substrate on the pedestal may involve, in some embodiments, heating individual zones of a substrate using many small individual pedestal heaters. However, the pedestal shafts may have small spaces to run wires for the individual pedestal heaters, which can limit the number of individual pedestal heaters that may be included in a pedestal. In addition, radio frequency (RF) arcing within a process chamber can limit the density and type of individual pedestal heaters that can be used. The above-described issues with pedestal heaters limit the number of temperature zones that can be controlled on the pedestals, which can therefore limit achievable temperature uniformity of the substrates during processing.

In addition to the foregoing, pedestal heaters are very expensive and can be challenging to manufacture. For example, some pedestal heaters include multiple heating zones embedded in ceramic materials. X-Ray inspection of the ceramic materials is used to verify that the heating elements are spaced within predetermined tolerances of each other. Control of the individual heating elements can include radio frequency (RF) filters on every wire coupled to the heating elements. All of the aforementioned issues with pedestal heaters increase the cost of manufacture of the process chambers.

Some process chambers include a heater or cooler in the chamber bodies or walls configured to create uniform wall temperatures. However, uniform wall temperatures do not necessarily correlate to uniform substrate temperatures at the pedestal. For example, the pedestal heaters may provide limited uniform heating of the substrates. However, uniform wall temperatures do not necessarily provide uniform substrate temperatures and may adversely affect the limited uniform heating provided by the pedestal heaters.

Process chambers, electronic device processing systems, and methods disclosed herein can provide non-uniform temperature control of process chamber walls so as to improve temperature uniformity of substrates. The non-uniform wall temperature control in one aspect enables more uniform substrate temperatures, which can improve uniformity of deposition and/or etch of the substrates. For example, vertical walls of a process chamber may be divided into multiple zones (e.g., four or more zones) that may be separately heated and/or cooled to provide non-uniform heating and/or cooling of the process chamber walls. The non-uniform heating and/or cooling may be performed in a manner so as to provide substantially uniform heating of a substrate housed within the process chamber.

Further details of example embodiments of temperature-controllable process chambers including temperature-controllable walls, electronic device processing systems, and methods of manufacturing substrates are described with reference to FIGS. 1-3 herein.

Reference is now made to FIG. 1, which illustrates a schematic diagram of an example embodiment of an electronic device processing system 100 according to one or more embodiments of the present disclosure. The electronic device processing system 100 may include a mainframe housing 102 including housing walls defining a transfer chamber 104. A transfer robot 106 (shown as a dotted circle) may be at least partially housed within the transfer chamber 104. The transfer robot 106 may be configured to place and extract substrates to and from destinations via operation of robot arms (not shown) of the transfer robot 106.

The motion of the various robot arm components of the transfer robot 106 may be controlled by suitable commands to a drive assembly (not shown) containing a plurality of drive motors of the transfer robot 106 as commanded from a controller 108. Signals from the controller 108 may cause motion of the various components of the transfer robot 106. Suitable feedback mechanisms may be provided for one or more of the components by various sensors, such as position encoders, or the like. Any suitable robot construction may be used.

In the embodiments shown in FIG. 1, the transfer chamber 104 in the depicted embodiment may be square or slightly rectangular in shape and may include a first facet 104A, second facet 104B opposite the first facet 104A, a third facet 104C, and a fourth facet 104D opposite the third facet 104C. The first facet 104A, second facet 104B, third facet 104C, and fourth facet 104D may be planar and entryways into the chamber sets may be perpendicular to the respective facets, for example. However, other suitable shapes of the mainframe housing 102, transfer chamber 104, and/or facets 104A-104D, and/or other numbers of facets and/or process chambers are possible. For example, the transfer chamber 106 can be pentagonal, hexagonal, heptagonal, octagonal, or even nonagonal, or the like.

The destinations for the transfer robot 106 may be a first process chamber set 110A, 110B, coupled to the first facet 104A and which may be configured and operable to carry out processes on the substrates delivered thereto. The processes may be any suitable process such as described above. Other processes may be carried out on substrates therein.

The destinations for the transfer robot 106 may also be a second process chamber set 110C, 110D that may be opposed from the first process chamber set 110A, 110B. The second process chamber set 110C, 110D may be coupled to the second facet 104B and may be configured to carry out any suitable processes on the substrates, such as any of the processes mentioned above. Likewise, the destinations for the transfer robot 106 may also be a third process chamber set 110E, 110F coupled to the third facet 104C that may be opposed from a load lock apparatus 112. The third process chamber set 110E, 110F may be configured to carry out any suitable processes on the substrates, such as any of the processes mentioned above. Regardless of the shape of the transfer chamber 104, the process chambers are configured to carry out one or more processes on the substrates received therein. One or more of the process chambers, such as 110A-110F can be temperature controllable process chambers, to be described fully herein below. In some embodiments, all of the process chambers 110A-110F are temperature controllable.

Substrates may be received into the transfer chamber 104 from an equipment front end module (EFEM) 114, and may also exit the transfer chamber 104, to the EFEM 114, through a load lock apparatus 112 that is coupled to a surface (e.g., a rear wall) of the EFEM 114. The load lock apparatus 112 may include one or more load lock chambers therein (e.g., load lock chambers 112A, 112B, for example). Load lock chambers 112A, 112B that are included in the load lock apparatus 112 may be single wafer load locks (SWLL) chambers, dual wafer load locks (DWLL) chambers, or other multi-wafer chambers, batch load locks, or combinations thereof, for example.

In some embodiments, the EFEM 114 may be an enclosure having walls (such as front wall, rear wall, and side walls, a top wall, and a bottom wall, for example) forming an EFEM chamber 114C. One or more load ports 115 may be provided on a wall (e.g., front wall) of the EFEM 114 and may be configured to receive one or more substrate carriers 116 (e.g., FOUPs) thereat. Three substrate carriers 116 are shown in FIG. 1, but more or less numbers of substrate carriers 116 may be docked with the EFEM 114.

The EFEM 114 may include a suitable load/unload robot 118 (shown dotted) of conventional construction within the EFEM chamber 114C thereof. The load/unload robot 118 may be configured and operational, once a door of a substrate carrier 116 is opened, to extract substrates from the substrate carrier 116 and feed the substrates through the EFEM chamber 114C and into the one or more load lock chambers 112A, 112B of the load lock apparatus 112. The EFEM chamber 114C may include an environmentally-controlled atmosphere, such as an $N_2$ atmosphere, or the like.

Figure 2A:
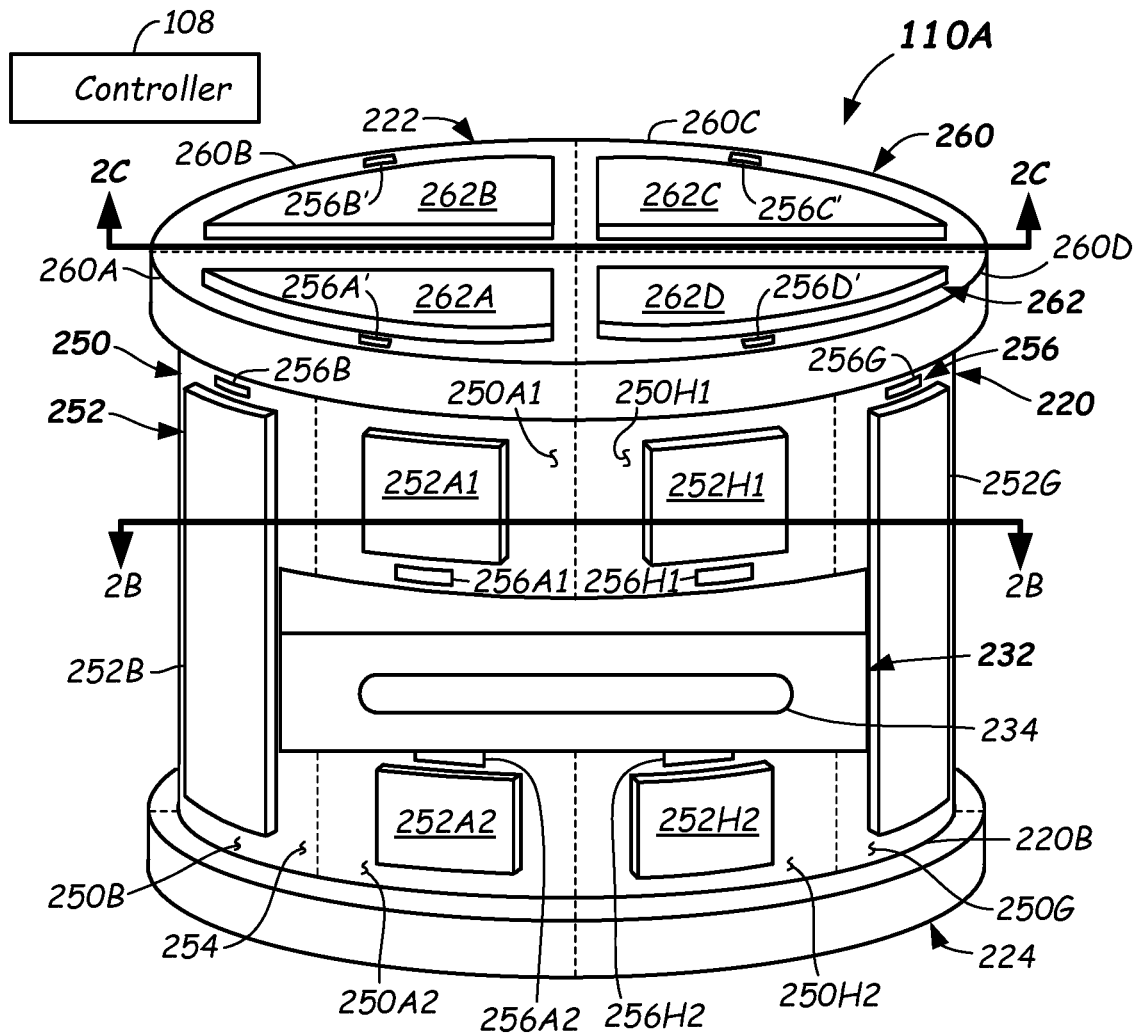
FIG. 2A illustrates a top, isometric view of a temperature-controllable process chamber according to one or more embodiments of the disclosure.
Figure 2B:
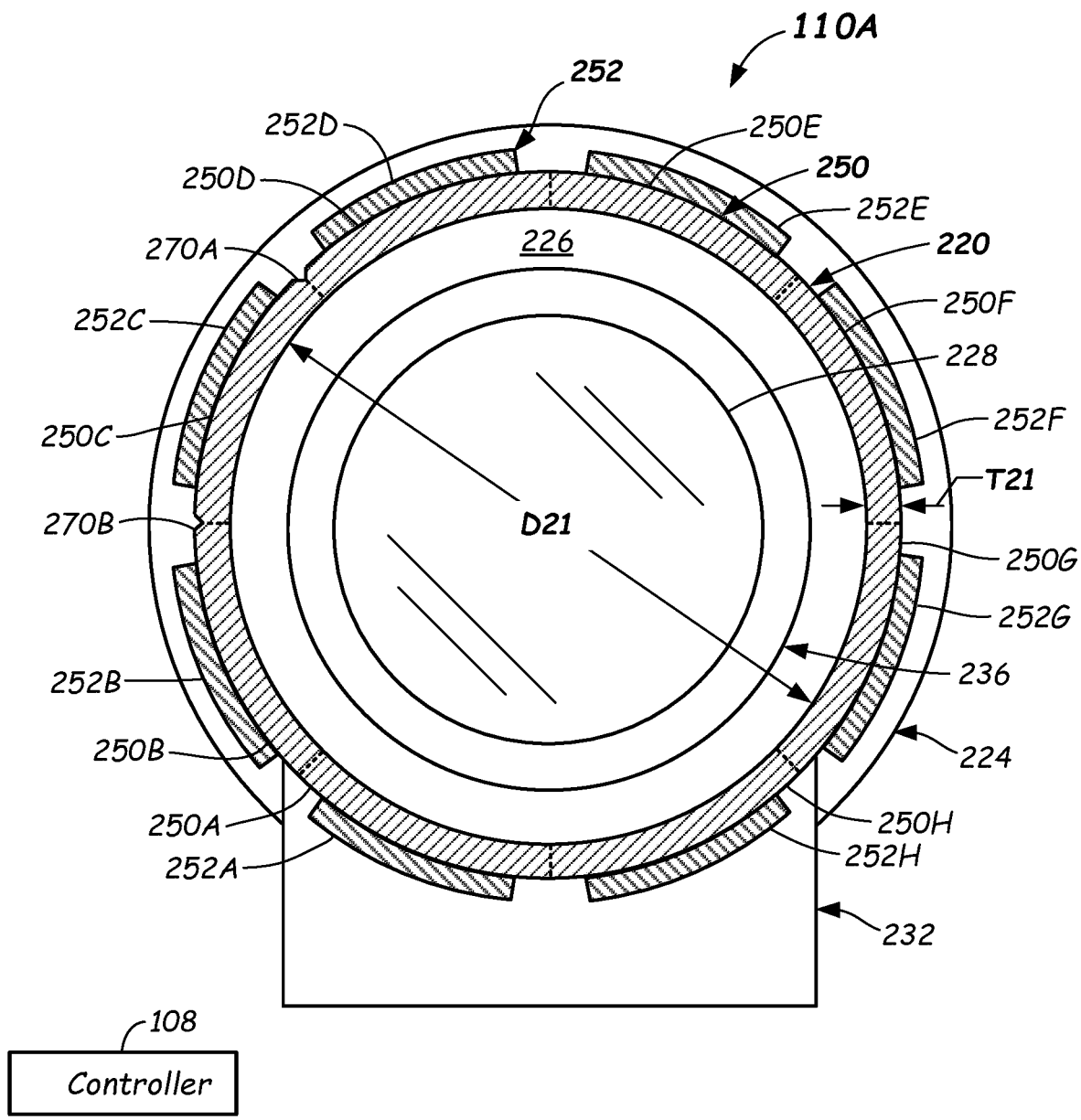
FIG. 2B illustrates a top, cross-sectioned view of a temperature-controllable process chamber according to one or more embodiments of the disclosure.
Figure 2C:
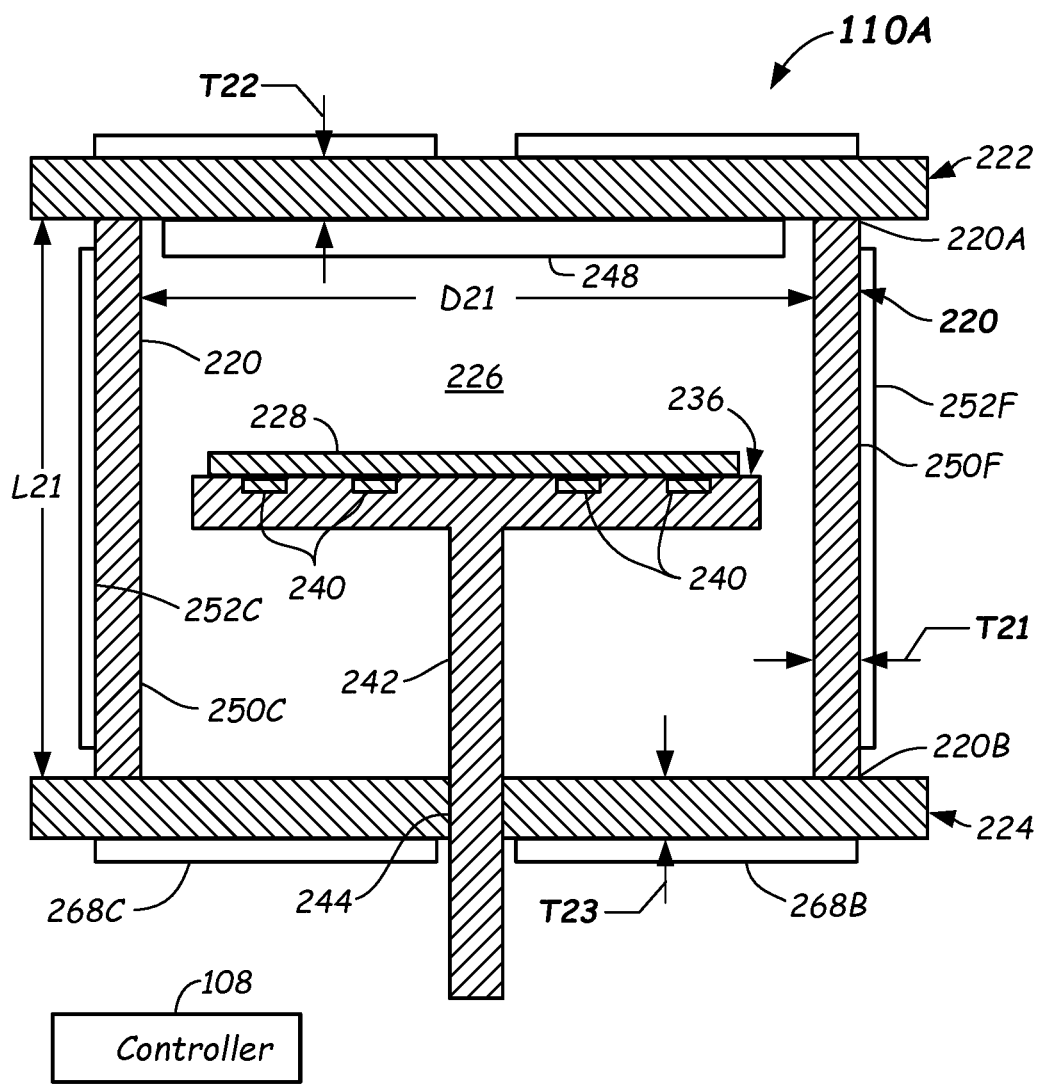
FIG. 2C illustrates a side, cross-sectioned view of a temperature-controllable process chamber according to one or more embodiments of the disclosure.

Reference is now made to FIG. 2A, which illustrates a top, isometric view of an embodiment of a process chamber 110A. The other process chambers 110B-110F can be of the same or similar construction as described herein. Additional reference is made to FIG. 2B, which illustrates a top, cross-sectioned view of the process chamber 110A, and FIG. 2C, which illustrates a side, cross-sectioned view of the process chamber 110A. The process chamber 110A may be at least partially defined by one or more vertical walls. In the embodiments of FIGS. 2A-2C, the process chamber 110A may be at least partially defined by a cylindrical vertical wall 220. The process chamber 110A may have shapes other than cylindrical. The vertical wall 220 may have a length L21 extending between a top portion 220A and a bottom portion 220B. In some embodiments, the length L21 (FIG. 2C) may be about 40 cm, for example. The vertical wall 220 may have thickness T21 of about 2 cm, for example. In some embodiments, the thickness T21 of the vertical wall 220 may vary. A top cover 222 may abut the top portion 220A of the vertical wall 220. The top cover 222 may have a thickness T22 of about 3 cm, for example. A bottom cover 224 may abut the bottom portion 220B of the vertical wall 220. The bottom cover 224 may have a thickness T23 of about 3 cm, for example. The vertical wall 220, the top cover 222, and the bottom cover 224 may be made of aluminum for example and may all constitute walls of the process chamber 110A. Other materials may be used to make the vertical wall 220, the top cover 222, and the bottom cover 224. Other dimensions may also be used.

The vertical wall 220, the top cover 222, and the bottom cover 224 may at least partially define a chamber portion (sometimes referred to herein as a chamber 226) that is configured to receive a substrate 228. The chamber 226 may be cylindrical and may have a diameter D21, which may be about 40 cm, for example. In other embodiments, the chamber 226 may have shapes other than cylindrical and may be of a different diameter.

The process chamber 110A may have one or more devices coupled thereto or comprising a part thereof that sink heat from the vertical wall 220, the top cover 222, and/or the bottom cover 224. The heat sinking provided by such sink devices may be non-uniform. For example, a first area of the vertical wall 220 may be coupled to a device that sinks heat. Thus, heat sinking may be greater in the first area of the vertical wall 220 than in a second area of the vertical wall 220. Accordingly, the first area and the second area may be at different temperatures during operation of the process chamber 110A. One such heat sinking device may be an access device 232 that may be a portion of a gate valve that enables substrates to pass into and out of the chamber 226 via a slit opening 234. The gate valve may also hermetically seal the chamber 226 from the environment of the transfer chamber 104 (FIG. 1) in some embodiments. The access device 232 may be made of metal and may be a heat sink that affects the temperature uniformity of the vertical wall 220. In addition to the access device 232, the process chamber 110A may include other heat sinking devices attached thereto, such as mounting brackets, or process gas connections and conduits and cable ports passing into the chamber 226.

The opening 234 may be configured to pass a substrate 228 that may be to set on a pedestal 236 within the chamber 226. The pedestal 236 may include one or more pedestal heaters 240 (FIG. 2C) that are configured to heat the substrate 228. The pedestal 236 may be coupled to a shaft 242 that may extend through an opening 244 in the bottom cover 224. The shaft 242 may raise and lower the pedestal 236 in some embodiments and may include wires or conductors (not shown) that couple the pedestal heaters 240 to the controller 108 and or power source (not shown). In some embodiments the shaft 242 may raise the substrate 228 proximate an RF source 248 during processing, for example. The shaft 242, the opening 244, and the conductors passing through the shaft 242 and the opening 244 may affect the temperature uniformity of the substrate 228 during processing.

During some processing procedures performed on the substrate 228, by using the temperature-controlled process chamber 110A described herein, the temperature uniformity of the substrate 228 may be maintained within 2° C., or 1° C., 0.5° C., or even 0.1° C. across the entire substrate 228 in order to perform the process. The pedestal heaters 240 when used alone are ineffective in maintaining such temperature uniformity across the whole of the substrate 228. As described above, different areas of the vertical wall 220, the top cover 222, and the bottom cover 224 may have different heat sinking devices coupled thereto that affect the ability to achieve uniform heating of the substrate 228.

The process chamber 110A may include a plurality of zones (shown separated by dotted lines in FIG. 2B) that are individually temperature-controllable. The individual controllability can maintain the substrate 228 at a substantially uniform temperature during processing. For example, the zones may provide non-uniform temperature control (e.g., heating) to the vertical wall 220, the top cover 222, and/or the bottom cover 224 to offset heat sinking devices coupled to the process chamber 110A. The zones may be evenly spaced, meaning that each zone on a wall occupies the same amount of area. The non-uniform temperature control may provide for improved temperature uniformity across the substrate 228 during processing (temperature uniformity of the substrate 228 may be maintained within 2° C., or 1° C., 0.5° C., or even 0.1° C. across the entire substrate 228).

The vertical wall 220 may include a plurality of zones 250, wherein each of the zones 250 may include one of a plurality of temperature control devices 252. A zone 250 as used herein may be a portion of a wall or cover that includes a temperature control device 252. In some embodiments, the vertical wall 220 may include four or more zone 250. Eight zones are shown but any number of suitable multiple zones may be employed. The more zones 250 that are used, the more accurate the temperature control can be. In some embodiments, the entire peripheral or outer surface 254 of the vertical wall 220 is partitioned into zones 250.

In the embodiment depicted in FIGS. 2A-2C, the vertical wall 220 includes eight circumferential zones, referred individually as zones 250A-250H. One or more of the temperature control devices, such as the temperature control devices 252B and 252G, may extend in a vertically-oriented direction to locations proximate to the top cover 222 and the bottom cover 224 in each of the zones 250.

The temperature control devices 252 may be heaters, coolers, or both. In some embodiments, the temperature control devices 252 may include liquid transfer devices (not shown) that transfer liquid to heat and/or cool their respective zones 250. The controller 108 may control valves (not shown) or the like that control flow of the liquid through the temperature control devices 252. In some embodiments, the temperature control devices may be resistive heaters that are coupled to electric power sources. In some embodiments, the temperature control devices may be Peltier devices to accomplish heating or cooling that coupled to electric power sources. The controller 108 may turn the power sources on and off to regulate heating or cooling in the individual zones 250, for example.

The temperatures of the vertical wall 220 in one or more zones 250 may be measured by one or more temperature measurement devices 256, such as thermocouples. Optionally, RTDs (resistance temperature detectors), thermistors, or semiconductor-based integrated circuits (IC) can be used. The temperature measurement devices 256 may transmit data (e.g., temperature data) indicative of the temperatures of the individual zones 250 to the controller 108. The controller 108 may control the temperature control devices 252 in response to the data received from the temperature measurement devices 256.

One or more of the zones 250 may be split to accommodate irregularities in the vertical wall 220 or devices attached to the vertical wall 220. As shown in FIG. 2A, the zone 250A is split into two zones 250A1 and 250A2 and the zone 250H is split into two zones 250H1 and 250H2 to accommodate the access device 232. Each of the individual zones 250A1, 250A2, 250H1, and 250H2 may include a respective temperature control device 252A1, 252A2, 252H1, and 252H2 and a respective temperature measurement devices 256A1, 256A2, 256H1, and 256H2. The splitting of the zones 250A and 250H enables more precise temperature control of the substrate 228 in lieu of heat sinking that may be caused by the access device 232. Other zones may be split to accommodate other sinking devices coupled to the vertical wall 220.

As shown in FIG. 2A the top cover 222 may include a plurality of zones 260 (e.g., first cover zones). In some embodiments, the zones 260 cover the entire top cover 222. In the embodiment depicted in FIG. 2A, the top cover includes four zones 260, referred to individually as zones 260A-260D. Other embodiments may include different numbers of zones. Each of the zones 260 may include a temperature control device 262, which are referred to individually as the temperature control devices 262A-262D. In some embodiments, one or more of the zones 260 may include a temperature measurement device 256A'-256D' substantially similar to the temperature measurement devices 256A1, 256A2, 256H1, and 256H2. For example, each of the zones 260 may include a temperature measurement device.

Figure 2D:
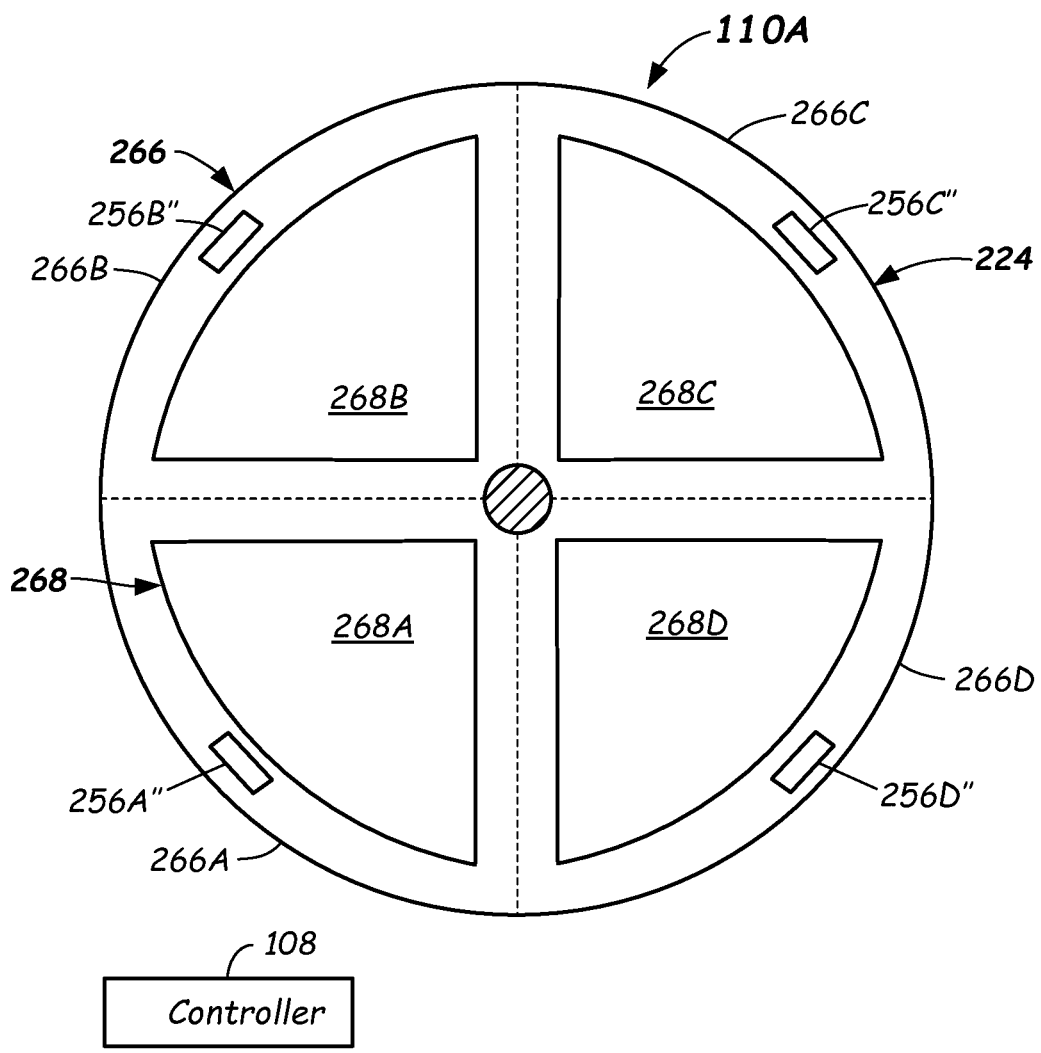
FIG. 2D illustrates a plan view of a bottom cover of a temperature-controllable process chamber according to one or more embodiments of the disclosure.

Additional reference is now made to FIG. 2D, which illustrates a plan view of the bottom cover 224 of the process chamber 110A. The bottom cover 224 may include one or more zones 266 that may have a similar arrangement as the zones 260 on the top cover 222. In the embodiment of FIG. 2A, the bottom cover 224 includes four zones 266, referenced individually as zones 266A-266D. Other embodiments may include fewer or more zones 266. The bottom cover 224 may include a plurality of temperature control devices 268 coupled thereto. In the embodiment of FIG. 2D, each of the zones 266 includes a temperature control device, which are referred to individually as the temperature control devices 268A-268D. In some embodiments, one or more zones 266 may include a temperature measurement device 256A"-256D", of the type described herein. The temperature control devices 268 and the temperature measurement devices 256A"-256D" may be coupled to the controller 108. The temperature control devices 268 may heat and/or cool the bottom cover 224 non-uniformly so as to substantially uniformly control the temperature of the substrate 228.

Some of the walls 250 may include one or more grooves that define boundaries between the zones and to at least partially thermally isolate the zones from each other. As shown in FIG. 2B, the zone 250C may be at least partially thermally isolated from the zone 250D by the groove 270A. The zone 250C may also be at least partially thermally isolated from the zone 250B by the groove 270B. Similar grooves may at least partially thermally isolate the zones 260 on the top cover 222 and the zones 266 on the bottom cover 224. In some embodiments, the grooves 270A, 270B may be filled with a thermally insulating material that enables a larger temperature difference between the zones 250. In some embodiments, the insulating material may include a ridge foam insulation or other materials, such as solid quartz components.

The process chamber 110A may apply different processes to the substrate 228 that exhibit the high temperature and substantial temperature uniformity across the substrate 228. For example, some processes may be performed with a temperature uniformity of better than 2%, other processes may be performed with a temperature uniformity of better than 1%, and other processes may be performed with a temperature uniformity of better than 0.5%, or even better than 0.1%. Better than means greater uniformity.

The thermal mass of the process chamber 110A may also not be uniform, which may adversely affect the temperature uniformity of the substrate 228. For example, the pedestal heaters 240 in the pedestal 236 may heat the substrate 228 to a specific temperature, but portions of the substrate 228 may have high temperature fluctuations due to the differing geometry of vertical wall 220, the top cover 222, and/or the bottom cover 224 of the process chamber 110A. The temperature of the substrate 228 located on the pedestal 236 may be measured. The effects of individual temperature control devices 252, 262, 268 on the temperature uniformity of the substrate 228 may also be measured to generate data and/or equations relating to heating and/or cooling by the temperature control devices 252, 262, 268 on the temperature uniformity of the substrate 228.

For example, individual temperature control devices 252, 262, 268 on the vertical wall 220, the top cover 222, and the bottom cover 224 may be set to individual set temperatures by the controller 108 to achieve a predetermined temperature uniformity of the substrate 228 during processing, wherein each of these set temperatures may be different from one another. Different zones can also be set to different set temperatures to accomplish different zone set temperatures. The control of individual temperature control devices may be performed in conjunction with heating the substrate 228 by way of the pedestal heaters 240.

The temperature uniformity of the substrate 228 may be measured by several methods. For example, a substrate coated with Si—O—C may be placed into the process chamber 110A. The Si—O—C reacts differently to different temperatures. By analyzing the Si—O—C after processing, the temperature uniformity of the substrate may be determined. The set temperatures of individual temperature control devices may then be set to provide a predetermined temperature uniformity across the substrate 228 within the tolerances described herein. In other embodiments, a material, such as Si—O—C, may be applied to a substrate during processing. Analysis of the material may provide information as to the temperature uniformity of the substrate 228. In some embodiments, the substrate 228 itself may affect the temperature gradient, so the above-described temperature measurements may be conducted for different types of substrates. Based on the temperature measurements, the temperatures of the individual temperature control devices 252, 262, 268 and zones thereof may be set by the controller 108.

Figure 3:
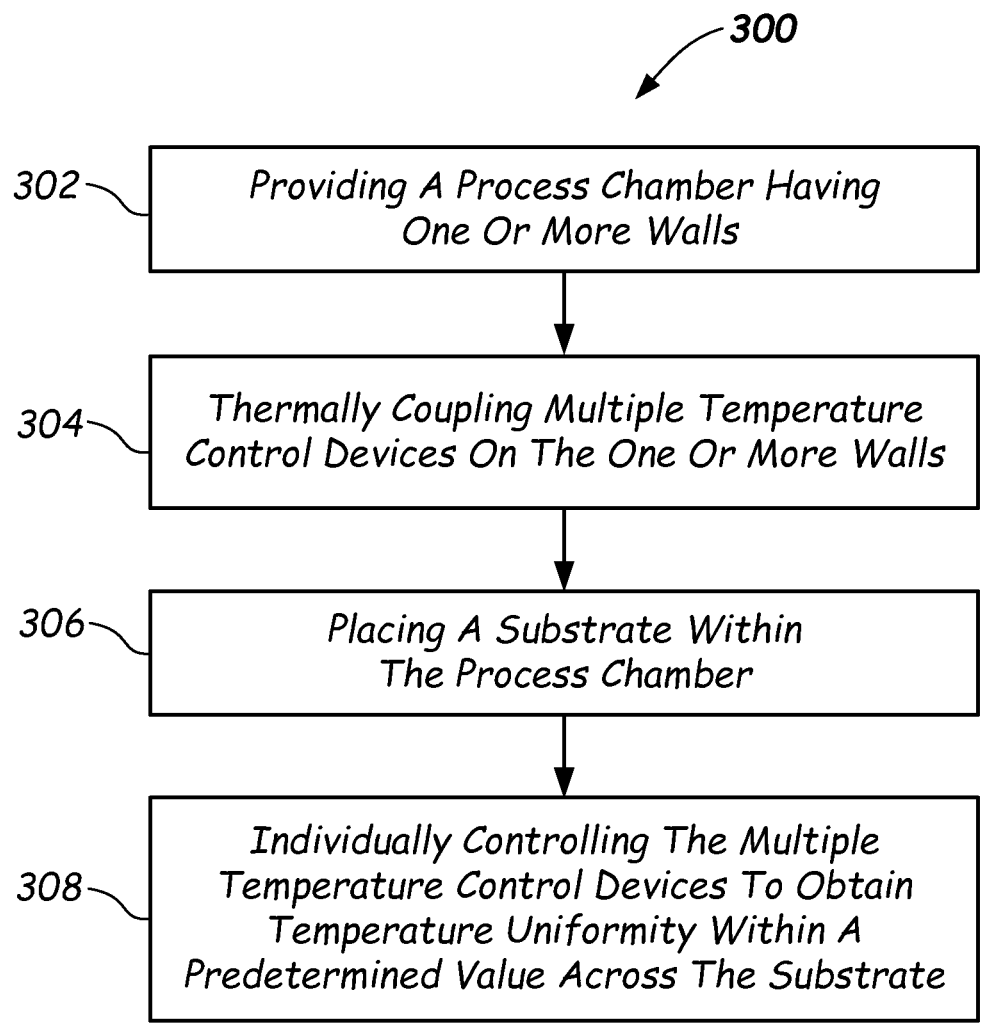
FIG. 3 illustrates a flowchart describing a method for manufacturing substrates according to one or more embodiments.

In another aspect, a method for processing substrates (e.g., substrate 228) is disclosed and illustrated by the flowchart 300 of FIG. 3. The method 300 may include, in 302, providing a process chamber (e.g., process chamber 110A) having one or more walls (e.g., vertical wall 220, top cover 222, and bottom cover 224). The method 300 may include, in 304, thermally coupling multiple temperature control devices (e.g., temperature control devices 252, 262, and/or 268) to the one or more walls. The method 300 may include, in 306, placing a substrate within the process chamber. The method 300 may include, in 308, individually controlling the multiple temperature control devices to obtain temperature uniformity within a predetermined value across the substrate. The temperature uniformity achieved is better than 2%, better than 1%, better than 0.5%, or even better than 0.1% in some embodiments. Better than means greater uniformity.

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. A process chamber for processing substrates, comprising:
one or more vertical walls at least partially defining a chamber portion of the process chamber;
multiple zones located about a periphery of the one or more vertical walls;
one or more grooves located in the periphery of the one or more vertical walls, the one or more grooves defining one or more boundaries between at least a first zone and a second zone;
temperature control devices, each thermally coupled to the one or more vertical walls in one of the multiple zones; and
a controller coupled to the temperature control devices and configured to set temperatures of one or more of the temperature control devices to obtain temperature uniformity within 2% across a substrate located in the chamber portion.

2. The process chamber of claim 1, further comprising one or more temperature measurement devices coupled to the periphery of the one or more vertical walls.

3. The process chamber of claim 1, further comprising a chamber pedestal located in the chamber portion and a pedestal heater located in the chamber pedestal, the chamber pedestal configured to receive the substrate and the pedestal heater configured to heat the substrate.

4. The process chamber of claim 1, wherein the controller is configured to control the temperatures of the temperature control devices to obtain temperature uniformity of better than 1% across the substrate.

5. The process chamber of claim 1, wherein the controller is configured to set the temperatures of the multiple temperature control devices in each of the multiple zones to obtain temperature uniformity of better than 0.5% across the substrate.

6. The process chamber of claim 1, wherein the temperature control devices are heaters.

7. The process chamber of claim 1, wherein the temperature control devices are evenly spaced on the periphery of the one or more vertical walls.

8. A process chamber for processing substrates, comprising:
one or more vertical walls at least partially defining a chamber portion of the process chamber;
multiple zones located about a periphery of the one or more vertical walls;
a first cover covering a first end of the chamber portion, the first cover including one or more first cover zones;
temperature control devices, each thermally coupled to the one or more vertical walls in one of the multiple zones;
additional temperature control devices, each coupled to an outer periphery of the first cover in one of the one or more first cover zones; and
a controller coupled to each of the temperature control devices and configured to set temperatures of the temperature control devices to obtain temperature uniformity of better than 2% across a substrate located in the chamber portion.

9. The process chamber of claim 8, further comprising:
a second cover covering a second end of the chamber portion, the second cover including one or more second cover zones;
a further temperature control devices, each coupled to the outer periphery of the second cover in one of the one or more second cover zones; and
the controller coupled to each of the further temperature control devices and configured to set the temperatures of the further temperature control devices to obtain temperature uniformity of better than 2% across the substrate located in the chamber portion.

10. The process chamber of claim 8, further comprising one or more temperature measurement devices coupled to the periphery of the one or more vertical walls.

11. The process chamber of claim 8, further comprising a chamber pedestal located in the chamber portion and a pedestal heater located in the chamber pedestal, the chamber pedestal configured to receive the substrate and the pedestal heater configured to heat the substrate.

12. The process chamber of claim 8, wherein the controller is configured to control the temperatures of the temperature control devices to obtain temperature uniformity of better than 1% across the substrate.

13. The process chamber of claim 8, wherein the controller is configured to set the temperatures of the temperature control device in each of the multiple zones to obtain temperature uniformity of better than 0.5% across the substrate.

14. The process chamber of claim 8, wherein the temperature control devices are heaters.

15. The process chamber of claim 8, wherein the temperature control devices are evenly spaced on the periphery of the one or more vertical walls.

16. An electronic device processing system, comprising:
a transfer chamber;
one or more process chambers coupled to the transfer chamber and configured to receive a substrate, at least one of the one or more process chambers comprising:
one or more walls, wherein the one or more walls comprise a first zone and a second zone, wherein a first temperature control device is coupled to a wall in the first zone and a second temperature control device is coupled to a wall in the second zone;
one or more grooves located in at least one of the one or more walls, the one or more grooves defining one or more boundaries between the first zone and the second zone; and
multiple temperature control devices coupled to the one or more walls; and
a controller coupled to the multiple temperature control devices and configured to set temperatures of the multiple temperature control devices to obtain temperature uniformity across the substrate within a predetermined value.

17. The electronic device processing system of claim 16, wherein the controller is configured to set the temperatures of the multiple temperature control devices to obtain temperature uniformity of better than 1% across the substrate.

18. The electronic device processing system of claim 16, further comprising one or more temperature measurement devices coupled to the one or more walls, the one or more temperature measurement devices configured to transmit temperature data to the controller.

19. The electronic device processing system of claim 16, wherein at least one of the multiple temperature control devices is a heater.

* * * * *